United States Patent
Schmitt

(10) Patent No.: US 10,495,716 B2
(45) Date of Patent: Dec. 3, 2019

(54) METHOD AND MAGNETIC RESONANCE APPARATUS FOR DISTORTION CORRECTION OF ACQUIRED SCAN DATA OF AN EXAMINATION OBJECT FROM AN ENLARGED FIELD OF VIEW AND RETURNING TO A DESIRED FIELD OF VIEW THEREAFTER

(71) Applicant: Siemens Healthcare GmbH, Erlangen (DE)

(72) Inventor: Peter Schmitt, Weisendorf (DE)

(73) Assignee: Siemens Healthcare GmbH, Erlangen (DE)

(*) Notice: Subject to any disclaimer, the term of this patent is extended or adjusted under 35 U.S.C. 154(b) by 154 days.

(21) Appl. No.: 15/717,070

(22) Filed: Sep. 27, 2017

(65) Prior Publication Data
US 2018/0088200 A1 Mar. 29, 2018

(30) Foreign Application Priority Data

Sep. 27, 2016 (DE) .................. 10 2016 218 536

(51) Int. Cl.
*G01R 33/565* (2006.01)
*G01R 33/54* (2006.01)
(Continued)

(52) U.S. Cl.
CPC ..... *G01R 33/56545* (2013.01); *G01R 33/543* (2013.01); *G01R 33/5608* (2013.01);
(Continued)

(58) Field of Classification Search
CPC ........ G01R 33/56454; G01R 33/56572; G01R 33/543; G01R 33/5608; G01R 33/4824;
(Continued)

(56) References Cited

U.S. PATENT DOCUMENTS

2008/0240335 A1* 10/2008 Manjeshwar .......... A61B 6/032
378/4
2010/0052676 A1* 3/2010 Sugiura ............. G01R 33/4833
324/309
(Continued)

OTHER PUBLICATIONS

Doran et al., "A complete distortion correction for MR images: I. Gradient warp correction," Phys Med Biol ,; vol. 50: pp. 1343-1361. (2005).
(Continued)

*Primary Examiner* — G. M. A Hyder
(74) *Attorney, Agent, or Firm* — Schiff Hardin LLP

(57) ABSTRACT

In a method and a magnetic resonance (MR) apparatus for distortion correction of MR-acquired scan data of an object, an entry is made into a computer in order to select desired field of view (FOV), in which scan data of the object under examination (U) is to be acquired. An enlarged field of view (gFOV) is created in the computer by enlarging the desired field of view (FOV) in at least one spatial direction. An MR scanner is operated in order to acquire MR scan data in the enlarged field of view. Distortions are corrected in a data set based on scan data from the enlarged field of view, by applying a distortion correction algorithm to that data set. The corrected data set is reduced in the computer to the desired field of view. The reduced corrected data set is made available from the computer for storage and/or display.

8 Claims, 3 Drawing Sheets

(51) Int. Cl.
*G01R 33/56* (2006.01)
*G06T 3/40* (2006.01)
*G06T 5/00* (2006.01)
*G01R 33/48* (2006.01)

(52) U.S. Cl.
CPC .......... *G01R 33/56572* (2013.01); *G06T 3/40* (2013.01); *G06T 5/002* (2013.01); *G01R 33/482* (2013.01); *G01R 33/4824* (2013.01); *G06T 2207/10088* (2013.01); *G06T 2207/20104* (2013.01)

(58) Field of Classification Search
CPC ......... G01R 33/482; G06T 3/40; G06T 5/002; G06T 2207/10088; G06T 2207/20104
See application file for complete search history.

(56) References Cited

U.S. PATENT DOCUMENTS

| | | | |
|---|---|---|---|
| 2012/0249143 A1 | 10/2012 | Umeda | |
| 2013/0137968 A1 | 5/2013 | Reisman et al. | |
| 2014/0197835 A1* | 7/2014 | Kamada | G01R 33/4824 324/309 |
| 2016/0313434 A1* | 10/2016 | Panther | G01R 33/385 |

OTHER PUBLICATIONS

Pusey et al., "Aliasing Srtifacts in MR imaging" Comput. Med. Imag. Graphics , vol. 12, No. 4, pp. 219-224 (1988).

* cited by examiner

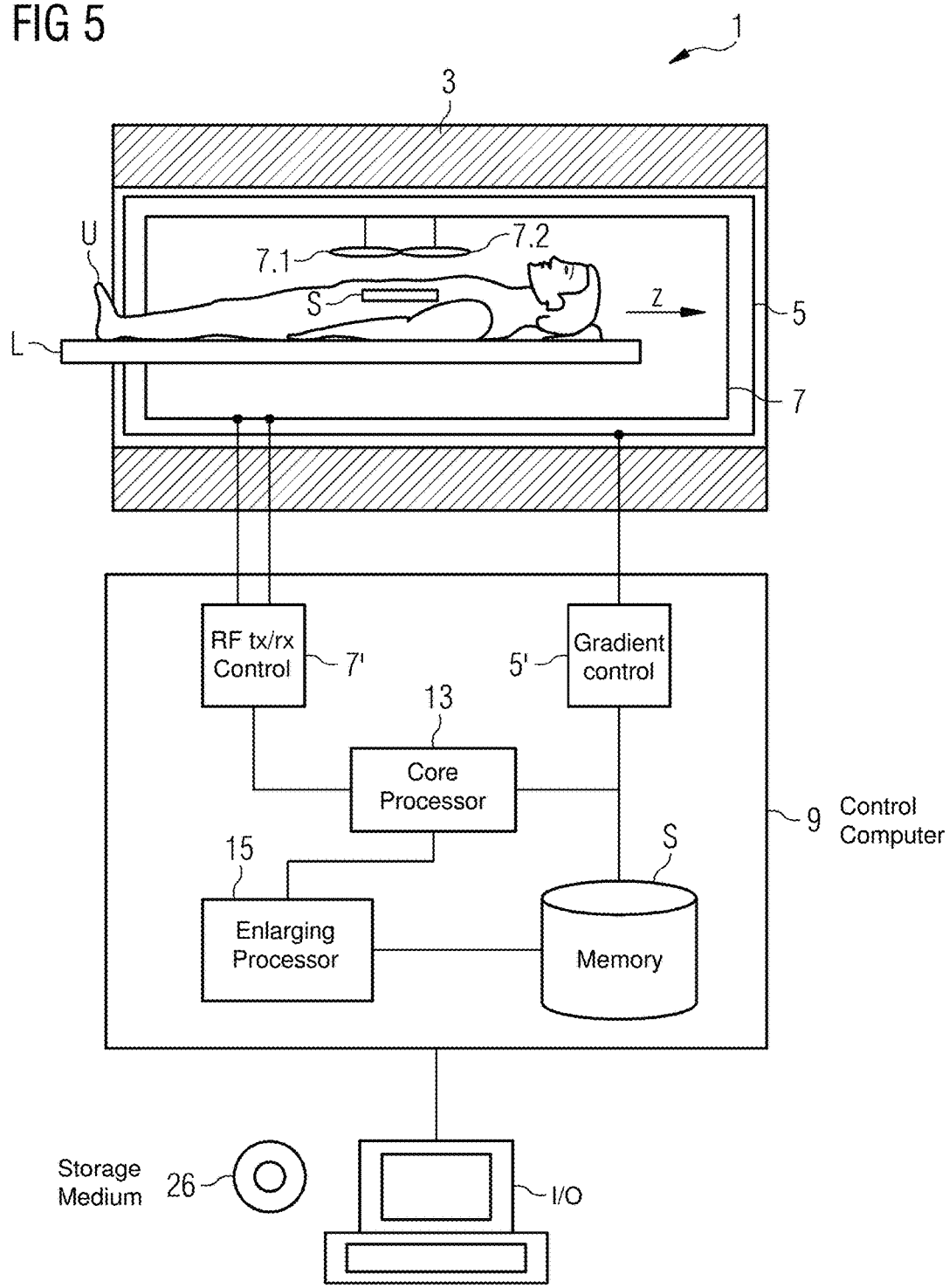

METHOD AND MAGNETIC RESONANCE APPARATUS FOR DISTORTION CORRECTION OF ACQUIRED SCAN DATA OF AN EXAMINATION OBJECT FROM AN ENLARGED FIELD OF VIEW AND RETURNING TO A DESIRED FIELD OF VIEW THEREAFTER

BACKGROUND OF THE INVENTION

Field of the Invention

The present invention concerns distortion correction of scan data of an object under examination acquired using a magnetic resonance (MR) apparatus.

Description of the Prior Art

Magnetic resonance (MR) technology is a known modality enabling images of the interior of an object under examination to be generated. Expressed in simplified terms, for this purpose the object under examination is positioned in a scanner of a magnetic resonance apparatus in a strong, static, homogeneous basic magnetic field, also known as the $B_0$ field, having field strengths of 0.2 to 7 tesla or more, so that the nuclear spins thereof align along the basic magnetic field. To trigger nuclear spin resonances, radiofrequency (RF) excitation pulses are applied to the object under examination e.g. for excitation or refocusing. The nuclear spin resonances triggered thereby are acquired as so-called k-space data, and MR images are reconstructed or spectroscopic data are obtained on the basis thereof. For spatially encoding the scan data, rapidly switched magnetic gradient fields are superimposed on the basic magnetic field. The scan data that are obtained are stored in a k-space matrix as complex numerical values. A corresponding MR image can be reconstructed from the populated k-space matrix e.g. by a multidimensional Fourier transform.

For spatial encoding using gradient fields, the gradient fields that are used are ideally linear, so that when a gradient is activated in a particular spatial direction, a linear relationship is produced between location along this direction and the local resonant frequency of the examined spin. In practice, however, the gradient field produced by a gradient coil is not perfect. The basic magnetic field B0 on which the gradient fields are superimposed may also exhibit non-linearities. These imperfections may result in image distortions or artifacts, i.e. the imaged object appears compressed, elongated and "warped" in the reconstructed image.

Because the imperfections of the gradient coils and of the basic magnetic field are known or measurable, the distortions in the images can be corrected. For this purpose algorithms can be used, which may operate only within a two-dimensional image or also in three spatial directions. Following distortion correction of this kind, the visualization of the object is largely correct again. An example of such a method is described in the article by Doran et al., "A complete distortion correction for MR images: I. Gradient warp correction.", Phys Med Biol 2005; 50: pp. 1343-1361.

However, a concomitant feature of such methods is that the "bending back" of the image means that no scan data are available for edge regions. This is due to the fact that, because of the imperfections of the gradient coils and possibly of the basic magnetic field B0, scan data at the edges would have had to be acquired outside the original, uncorrected field of view (FOV). These regions thus generally appear black, i.e. they provide no information. Because the entirety of the originally planned field of view has not been completely acquired due to these imperfections, important information in the edge areas may be missing. In addition, black areas of this kind at the edge of reconstructed images look unsightly.

These edge areas can be cropped prior to visualization of the reconstructed image, but this means that even if information is actually present in those areas, it is lost.

SUMMARY OF THE INVENTION

An object of the present invention is to avoid the aforementioned disadvantages associated with distortion correction of MR data.

The invention is based on the insight that so-called oversampling methods, which are already used to prevent so-called wrap-around artifacts by enlarging the field of view for the acquisition of the scan data by sampling more data points (e.g. twice the number or an even higher multiple) than would actually be required for the desired resolution, are suitable for use to prevent the occurrence areas in desired fields of view in which no information is present due to distortion. However, with oversampling methods for preventing wrap-around artifacts, the "excess" scan data acquired are already discarded prior to reconstruction of the images, in order to minimize the computing power necessary for the reconstruction.

An example of such an oversampling method is described in the article by Pusey et al., "Aliasing artifacts in MR imaging" Comput. Med. Imag. Graphics 1988; 12: pp. 219-224.

An inventive method for distortion correction of MR-acquired scan data of an object under examination has the following steps. An entry is made into a computer in order to select desired field of view (FOV), in which scan data of the object under examination (U) is to be acquired. An enlarged field of view (gFOV) is created in the computer by enlarging the desired field of view (FOV) in at least one spatial direction. An MR scanner is operated in order to acquire MR scan data in the enlarged field of view. Distortions are corrected in a data set based on scan data from the enlarged field of view, by applying a distortion correction algorithm to that data set. The corrected data set is reduced in the computer to the desired field of view. The reduced corrected data set is made available from the computer for storage and/or display.

The inventive enlarging of the desired field of view and distortion correction in data sets based on the scan data of an enlarged field of view enables a desired field of view (the complete desired field of view) to be acquired and visualized in spite of distortions caused by imperfections of the gradient coils and/or of the basic magnetic field, wherein the effect of distortions is reduced to a minimum. The imperfections of the magnetic resonance equipment that is used are therefore no longer visible, or at least less noticeable, in the reconstructed images. Acquired scan data are not discarded as long as such data can still be put to good use.

The desired field of view can be enlarged particularly economically in the read-out direction, because the high digitization rates currently available make it possible to increase the sampling rate above the level required for a desired resolution without penalty. This utilizes the fact that a larger field of view can be very easily acquired in the read-out direction without changing the gradient pulses, merely by using a larger sampling matrix and sampling bandwidth (i.e. more closely spaced sampling points for the same gradient at the same time). Such an enlargement of the desired field of view is also known as "frequency oversampling". Advantages of frequency oversampling are, for example, that no additional scanning time is required for acquiring the additional sampling points, and that the signal-to-noise ratio is unaffected. In general, frequency oversampling is already known for use to prevent wrap-around artifacts resulting from ambiguities in the measured frequencies. However, in this known technique, when reconstructing image data from the scan data, the excess scan data that have been obtained are (immediately) discarded, in order to save computing power.

With the inventive correcting of distortions in a data set based on scan data from the enlarged field of view, all the relevant scan data obtained are taken into account for the correction, which means that the entire desired field of view is actually corrected, in spite of the distortions contained in the scan data. It is only after correction that the data are reduced again to the desired field of view. As a result, no information is lost even in the edge regions of the desired field of view.

A magnetic resonance apparatus according to the invention has a scanner with a basic field magnet, a gradient coil arrangement, an RF antenna, and a control computer designed to implement the method according to the invention. The apparatus also has an RF transceiver and an enlarging processor.

The present invention also encompasses a non-transitory, computer-readable data storage medium encoded with programming instructions (program code) that, when the storage medium is loaded into a computer, cause the computer to execute any or all embodiments of the method according to the invention, as described above.

The advantages and embodiments described in relation to the method apply as well to the magnetic resonance apparatus, and the electronically readable data storage medium.

BRIEF DESCRIPTION OF THE DRAWINGS

FIG. 5 schematically illustrates a magnetic resonance apparatus according to the invention.

DESCRIPTION OF THE PREFERRED EMBODIMENTS

Figure 1:
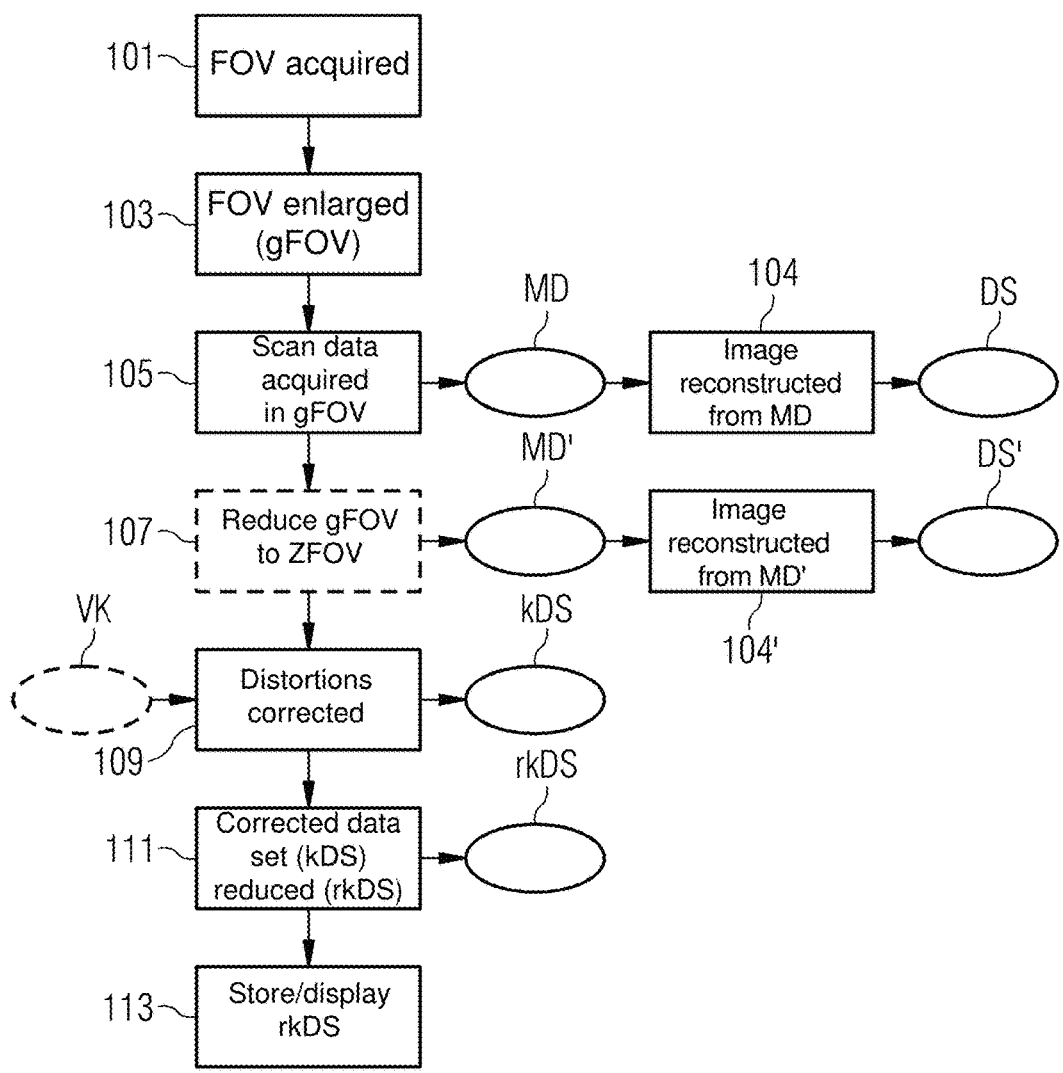
FIG. 1 is a flowchart of the method according to the invention.

FIG. 1 is a flowchart of the method according to the invention, wherein a desired field of view FOV from which scan data of an object under examination is to be acquired is first selected (block 101) in a computer.

The desired field of view FOV is then enlarged in the computer in at least one spatial direction (x-, y-, z-direction), thereby creating an enlarged field of view gFOV (block 103).

Scan data are acquired in the enlarged field of view gFOV (block 105), i.e. the MR scanner is operated so that RF pulses are applied to the object under examination according to a pulse sequence in which gradients are also activated in order to read out echo signals, produced by the RF excitation, as MR signals from the enlarged field of view. The detected MR signals are entered into k-space (as scan data, also called k-space data) along trajectories determined by the pulse sequence.

The scan data can be obtained by a Cartesian or by a non-Cartesian pulse sequence, i.e. the scan data can be entered into k-space according to a Cartesian pattern or according to a non-Cartesian pattern. The non-Cartesian patterns include radial or spiral k-space trajectories.

For enlarging the desired field of view FOV to the enlarged field of view gFOV, the desired field of view FOV can be enlarged in the read-out direction and/or in at least one phase encoding direction.

As mentioned above, enlarging the desired field of view in the read-out direction is particularly easy to accomplish by increasing the read-out rate, and allows the acquired scan data to be increased without other attendant disadvantages for the scan overall.

Enlarging the desired field of view in the phase encoding direction is possible, e.g., by increasing the phase encoding steps in an analogous manner to frequency oversampling ("phase oversampling"). However, the total scan time required is also increased, as more repetitions of the pulse sequence must be carried out as a function of the higher sampling rate in the phase encoding direction. However, enlarging the desired field of view FOV in the phase encoding direction simultaneously results in a reduction, if not prevention, of wrap-around artifacts in the phase encoding direction, which may justify the longer scan time.

Also in the case of non-Cartesian sampling of k-space for acquiring the scan data, the desired field of view FOV can be enlarged in at least one spatial direction, i.e. also in two or all three spatial directions accordingly by acquiring more scan data.

In a data set based on scan data from the enlarged field of view, distortions contained in the scan data are corrected (block 109).

For this purpose, for example, an image corresponding to the enlarged field of view gFOV can be reconstructed from the acquired scan data MD as the data set DS to be corrected (block 104), which is corrected e.g. using a distortion map in the known manner to produce a corrected data set kDS.

However, it is also possible to first reduce the enlarged field of view gFOV to an intermediate field of view ZFOV, e.g. by first reducing the scan data MD acquired in the enlarged field of view gFOV to scan data MD' from an intermediate field of view ZFOV that is smaller than the enlarged field of view gFOV, but larger than the desired field of view FOV (block 107). The scan data MD' of the intermediate field of view ZFOV is therefore a subset of the scan data MD' that were measured overall (in the enlarged field of view gFOV). Correction of the distortions (109) can then also be carried out in a data set DS' based on scan data from the intermediate field of view ZFOV, e.g. in image data DS' reconstructed from the scan data MD' in a step 104'.

The size of the intermediate field of view ZFOV to which the enlarged field of view gFOV is to be reduced can be selected on the basis of known distortions of the magnetic resonance apparatus used for acquiring the scan data such that all the information correctly present in the desired field of view FOV is acquired despite the distortions. In this way, it is possible to select the enlarged field of view gFOV large enough to be able to reliably prevent wrap-around artifacts, for example, but at the same time not to have to take into account this entire volume of all the acquired scan data MD for correcting the distortions 109. Rather the scan data MD' taken into account can be reduced such that, although all the information actually contained in the desired field of view FOV is present in spite of the contained distortions, no further scan data needs to be additionally "dragged along". In this way a generously enlarged field of view gFOV can be selected for the enlarged field of view gFOV without having to handle a corresponding large volume of data for the correction.

The correction of the distortions (109) is thus carried out in each case in a data set DS or DS' based on scan data MD or MD' from the enlarged field of view gFOV, thereby obtaining a corrected data set kDS.

The corrected data set kDS is reduced to the desired field of view FOV (block 111), thereby obtaining a reduced corrected data set rkDS. This reduced corrected data set rkDS can now be e.g. stored in a memory of the magnetic resonance apparatus used and/or e.g. displayed on a display unit of the magnetic resonance apparatus used (block 113).

Figure 2:
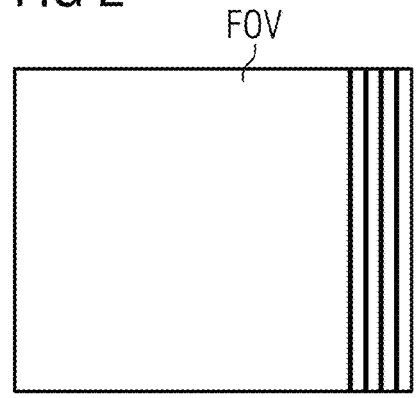
FIG. 2 schematically illustrates a desired field of view.

FIG. 2 schematically illustrates a desired field of view FOV having a typical structure S, represented by parallel vertical stripes, at the right edge of the desired field of view FOV.

Figure 3:
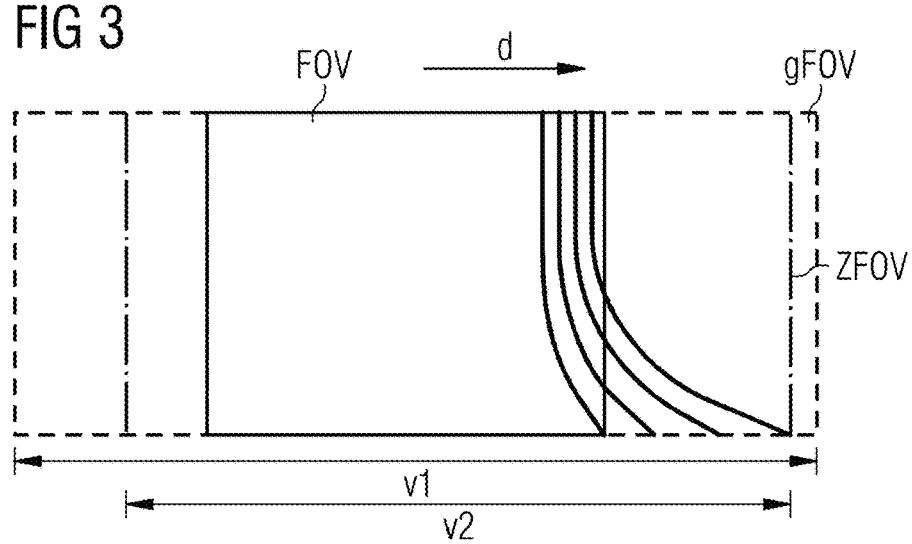
FIG. 3 schematically illustrates an enlarged field of view.

FIG. 3 schematically illustrates a field of view gFOV enlarged as an example in a spatial direction d, and corresponding to an enlargement of the desired field of view FOV from FIG. 2. As indicated by the now-deformed structure S, the scan data acquired in the enlarged field of view gFOV contains distortions, e.g. due to non-linearities of the gradient fields, which deform the structure S such that it is no longer inside the desired field of view FOV at the lower right-hand edge. The field of view gFOV enlarged in the spatial direction d to a length v1 also completely covers the deformed structure S. As described above, the scan data acquired in the enlarged field of view gFOV can initially be first reduced to scan data from an intermediate field of view ZFOV, which is smaller than the enlarged field of view gFOV but larger than the desired field of view FOV. In the example shown, the enlarged field of view gFOV has been shortened in the spatial direction d to a length v2. This shortening can be selected on the basis of known imperfections of a magnetic resonance apparatus (scanner) used for acquiring the scan data, and therefore on the basis of known distortions that occur, such that all the information actually contained in the desired field of view FOV (such as e.g. a structure S) is completely contained in the intermediate field of view ZFOV in spite of the distortions occurring. The distortion correction to be carried out can now be performed in a data set based on the intermediate field of view. This enables e.g. computing time and storage capacity to be saved, without information actually contained in the desired FOV being lost due to distortions.

Figure 4:
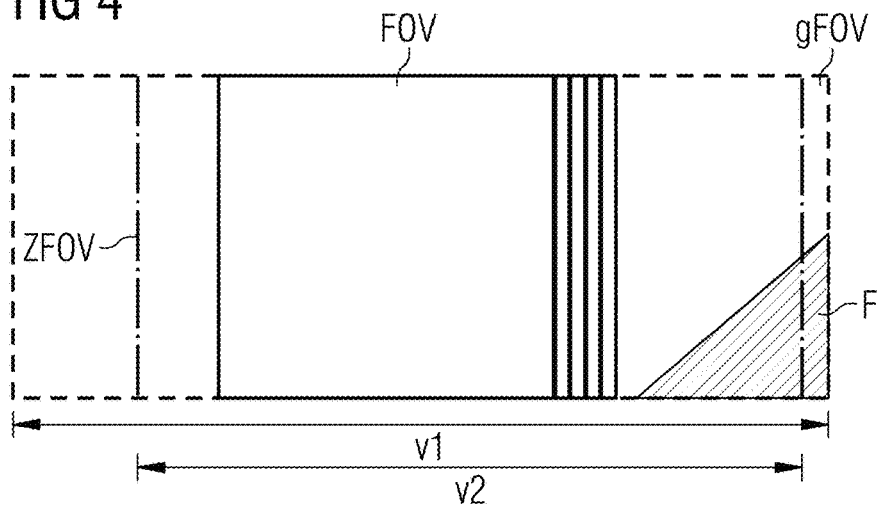
FIG. 4 schematically illustrates a corrected data set.

The corrected data set that can be obtained by distortion correction of the enlarged field of view gFOV shown in FIG. 3 or of the intermediate field of view ZFOV shown in FIG. 3 is schematically illustrated in FIG. 4. As a result of the correction, the structure S still deformed in FIG. 3 is disposed correctly in the field of view FOV (cf. FIG. 2). To achieve this in the example shown, a region F in which no information is present (shown hatched) has been created at the lower right edge of the enlarged field of view gFOV or in the intermediate field of view ZFOV, as the case may be. The corrected enlarged field of view gFOV or the corrected intermediate field of view ZFOV can now be reduced again to the desired field of view FOV which is stored and/or displayed as a reduced corrected data set, and in which no regions without information are present.

The inventive method is particularly advantageous for peripheral MR angiography in which a number of, e.g., coronally positioned 3D volumes are acquired at different levels, i.e. at different positions in the longitudinal direction, in the object under examination. In such scans, the read-out direction usually points in the z-direction, i.e. the longitudinal direction, of the basic field magnet. The images taken at the individual levels are usually combined into an overview image (so-called "composing"). For composing, a certain overlap region of the scan data acquired at the individual levels is necessary, from which an optimized transition can be extracted, e.g. using an algorithm. If information is missing in the edge regions of the scan data acquired at the individual levels, the overlap region must be selected large enough to enable this missing information to be compensated. With the method according to the invention, the fields of view to be acquired at the individual levels are completely imaged in each case, which means that the overlap regions can be significantly reduced and/or the composing of the images obtained at the individual levels is significantly improved.

FIG. 5 schematically illustrates a magnetic resonance apparatus 1 according to the invention. The apparatus 1 has a scanner with a basic field magnet 3 that generates a basic magnetic field, a gradient coil arrangement 5 that generates the gradient fields, an RF antenna 7 for emitting and receiving RF signals, and a control computer 9 designed to carry out the method according to the invention. In FIG. 5, these subunits of the magnetic resonance apparatus 1 are shown only in schematic form. The RF antenna 7 may be formed of a number of subunits, e.g. a number of coils such as the schematically illustrated coils 7.1 and 7.2, or more coils that can be designed only to radiate RF signals, or only to receive the RF (MR) signals triggered thereby, or both.

To examine an object under examination U, e.g. a patient or a phantom, the object U is introduced on a table L into the scanner of the magnetic resonance apparatus 1, in the imaging volume thereof. The slice S represents a typical target volume of the object under examination from which scan data are to be acquired.

The control computer 9 controls the magnetic resonance apparatus 1 and in particular controls the gradient coil arrangement 5 via a gradient controller 5', and the RF antenna 7 via an RF transmit/receive controller 7'. The RF antenna 7 can have a number of channels in which signals can be individually transmitted or received.

The RF antenna 7 in conjunction with its RF transmit/receive controller 7' is responsible for generating and radiating (transmitting) an alternating RF field for manipulating the spins in a region to be manipulated (e.g. in slices S to be scanned) of the object under examination U. The center frequency of this alternating RF field, also termed the B1 field, must be close to the resonant frequency of the spins to be manipulated. To generate the B1 field, currents controlled by the RF transmit/receive controller 7' are applied to the RF coils in the RF unit 7.

The control computer 9 additionally has an enlarging processor 15 with which a desired field of view can be inventively enlarged, and reduced again, and therefore controls how much scan data are acquired (in the respective spatial directions) and/or are actually used for further processing. Overall the control computer 9 is designed to implement the method according to the invention for preventing artifacts during the acquisition of data of an object under examination.

A core processor 13 incorporated in the control computer 9 is designed to carry out all the computing operations required for the necessary measurements and determinations. Intermediate results and results required for this purpose or determined thereby can be stored in a memory M of the control computer 9. The units shown need not necessarily be regarded as physically separate units, but merely represent a subdivision into conceptual entities, which can also be implemented in fewer units or even in a single physical unit.

Via an input/output device I/O of the magnetic resonance apparatus 1, control commands can be issued to the magnetic resonance apparatus, e.g. by a user, and/or results of the control computer 9, such as image data, can be displayed.

The method described herein can be made available in the form of computer code that causes the described method to be implemented by the control computer 9 when executed by the control computer 9. The code is stored on an electronically readable data storage medium 26 that can be loaded into the control computer 9 of the magnetic resonance apparatus 1.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for distortion correction of magnetic resonance (MR)-acquired scan data of an object under examination, comprising:
    in a computer, selecting a desired field of view in which scan data of an object under examination are to be acquired;
    in said computer, creating an enlarged field of view by enlarging the desired field of view in at least one spatial direction;
    with said computer, operating an MR scanner in order to acquire scan data in the enlarged field of view;
    in said computer, reducing the scan data acquired in the enlarged field of view to scan data from an intermediate field of view, which is smaller than the enlarged field of view but larger than the desired field of view;
    in said computer, applying a distortion correction algorithm to a data set based on the scan data from the intermediate field of view, in order to produce a corrected data set;
    in said computer, reducing the corrected data set to the desired field of view, in order to produce a reduced corrected data set; and
    providing the reduced corrected data set in electronic form as a data file from said computer.

2. The method as claimed in claim 1, comprising enlarging the desired field of view in a read-out direction and/or in a phase encoding direction used when acquiring the scan data.

3. The method as claimed in claim 1, comprising selecting a size of the intermediate field of view based on known distortions of the MR scanner.

4. The method as claimed in claim 1, comprising operating the MR scanner with a Cartesian pulse sequence in order to acquire the scan data.

5. The method as claimed in claim 1, comprising operating the MR scanner with a non-Cartesian pulse sequence in order to acquire the scan data.

6. The method as claimed in claim 5, comprising enlarging the desired field of view in two or three spatial directions in order to obtain the enlarged field of view.

7. A magnetic resonance (MR) apparatus comprising:
    an MR data acquisition scanner; and
    a computer configured to:
        select a desired field of view in which scan data of an object under examination are to be acquired by operation of said MR scanner;
        create an enlarged field of view by enlarging the desired field of view in at least one spatial direction;
        operate said MR scanner in order to acquire scan data in the enlarged field of view;
        reduce the scan data acquired in the enlarged field of view to scan data from an intermediate field of view, which is smaller than the enlarged field of view but larger than the desired field of view;
        apply a distortion correction algorithm to a data set based on the scan data from the intermediate field of view, in order to produce a corrected data set;
        reduce the corrected data set to the desired field of view, in order to produce a reduced corrected data set; and
        provide the reduced corrected data set in electronic form as a data file from said computer.

8. A non-transitory, computer-readable data storage medium encoded with programming instructions, said storage medium being loaded into a computer of a magnetic resonance (MR) apparatus comprising an MR data acquisition scanner and said programming instructions causing said computer to:
    select a desired field of view in which scan data of an object under examination are to be acquired;
    create an enlarged field of view by enlarging the desired field of view in at least one spatial direction;
    operate said MR scanner in order to acquire scan data in the enlarged field of view;
    reduce the scan data acquired in the enlarged field of view to scan data from an intermediate field of view, which is smaller than the enlarged field of view but larger than the desired field of view;
    apply a distortion correction algorithm to a data set based on the scan data from the intermediate field of view, in order to produce a corrected data set;
    reduce the corrected data set to the desired field of view, in order to produce a reduced corrected data set; and
    provide the reduced corrected data set in electronic form as a data file from said computer.

* * * * *